(12) United States Patent
Huang et al.

(10) Patent No.: US 10,283,371 B2
(45) Date of Patent: *May 7, 2019

(54) SPACER-DAMAGE-FREE ETCHING

(71) Applicant: Taiwan Semiconductor Manufacturing Company, Ltd., Hsinchu (TW)

(72) Inventors: Tsung-Min Huang, Taichung (TW); Chung-Ju Lee, Hsinchu (TW); Yung-Hsu Wu, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/457,084

(22) Filed: Mar. 13, 2017

(65) Prior Publication Data
US 2017/0186622 A1 Jun. 29, 2017

Related U.S. Application Data

(63) Continuation of application No. 14/796,153, filed on Jul. 10, 2015, now Pat. No. 9,601,346, which is a (Continued)

(51) Int. Cl.
| | |
|---|---|
| *H01L 21/027* | (2006.01) |
| *H01L 21/02* | (2006.01) |
| *H01L 21/311* | (2006.01) |
| *H01L 21/768* | (2006.01) |
| *H01L 21/033* | (2006.01) |
| *H01L 21/308* | (2006.01) |

(52) U.S. Cl.
CPC .... *H01L 21/31144* (2013.01); *H01L 21/0273* (2013.01); *H01L 21/02118* (2013.01); *H01L 21/0332* (2013.01); *H01L 21/0337* (2013.01); *H01L 21/3086* (2013.01); *H01L 21/31116* (2013.01); *H01L 21/76816* (2013.01); *H01L 21/76877* (2013.01)

(58) Field of Classification Search
USPC .................. 438/669, 670, 671, 672, 674
See application file for complete search history.

(56) References Cited

U.S. PATENT DOCUMENTS

| 7,015,110 B2 * | 3/2006 | Ning ............... H01L 23/5223 257/E21.019 |
| 8,409,962 B2 | 4/2013 | Xiao et al. |
| (Continued) | | |

*Primary Examiner* — Timor Karimy
(74) *Attorney, Agent, or Firm* — Haynes and Boone, LLP

(57) ABSTRACT

A method of patterning a semiconductor device is disclosed. A tri-layer photoresist is formed over a plurality of patterned features. The tri-layer photoresist includes a bottom layer, a middle layer disposed over the bottom layer, and a top layer disposed over the middle layer, the top layer containing a photo-sensitive material. The top layer is patterned via a photolithography process, the patterned top layer including an opening. The opening is extended into the bottom layer by etching the bottom layer and continuously forming a protective layer on etched surfaces of the bottom layer and on exposed surfaces of the patterned features. The bottom layer is removed. At least some portions of the protective layer remain on the exposed surfaces of the patterned features after the bottom layer is removed.

19 Claims, 18 Drawing Sheets

Related U.S. Application Data continuation of application No. 14/084,744, filed on Nov. 20, 2013, now Pat. No. 9,093,386.

(56) References Cited

U.S. PATENT DOCUMENTS

| | | | |
|---|---|---|---|
| 2003/0013316 A1* | 1/2003 | Kim | H01L 21/76808 438/737 |
| 2006/0138577 A1* | 6/2006 | Hashimoto | H01L 27/1462 257/432 |
| 2009/0045482 A1* | 2/2009 | Liaw | H01L 21/76232 257/510 |
| 2009/0191711 A1* | 7/2009 | Rui | G03F 7/40 438/695 |
| 2012/0068356 A1* | 3/2012 | Ahles | B81C 1/00095 257/774 |
| 2013/0048604 A1 | 2/2013 | Kang et al. | |
| 2014/0011351 A1 | 1/2014 | Yeh | |

* cited by examiner

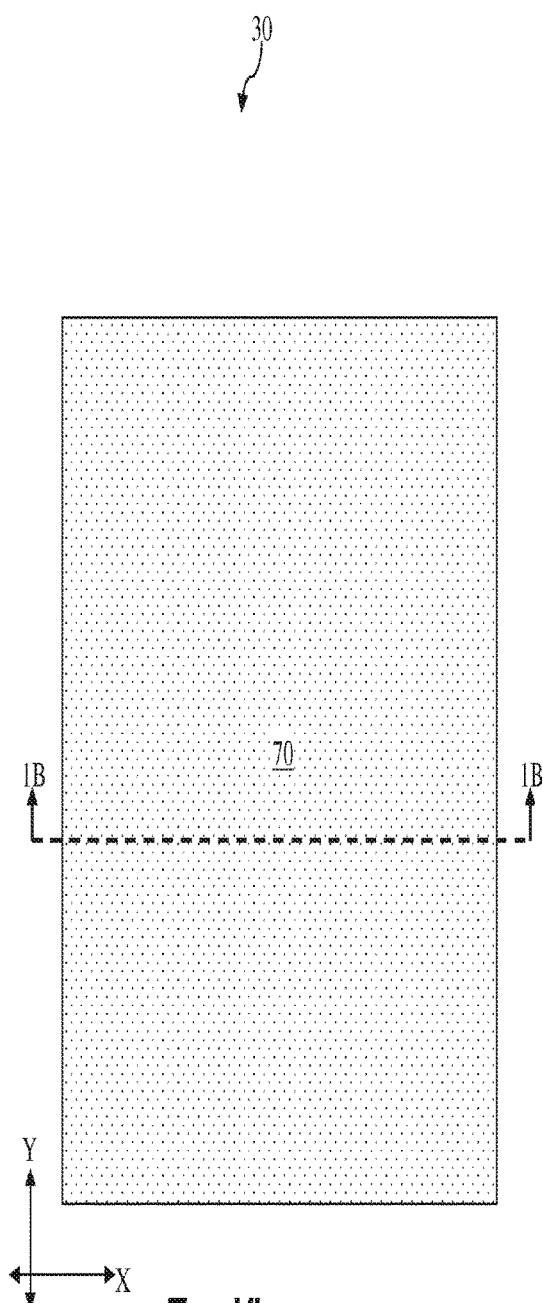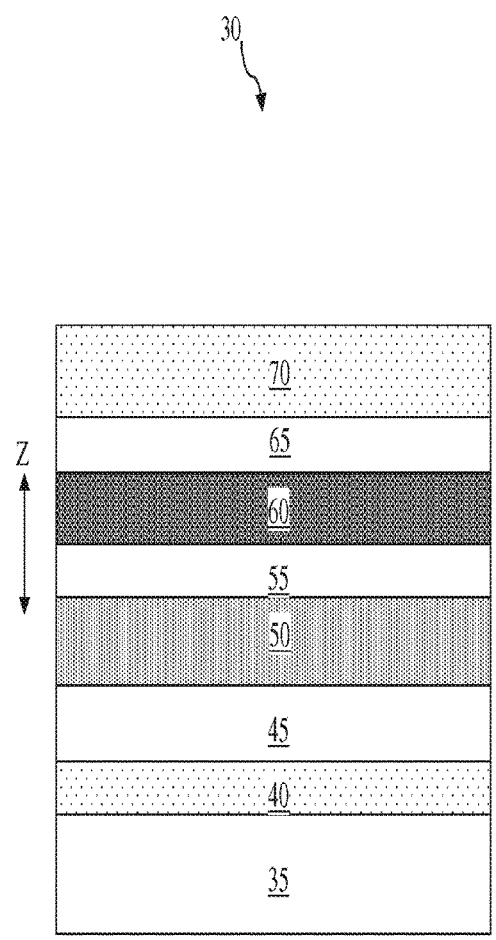
Top View
Fig. 1A
Cross-sectional View
Fig. 1B

*Top View*

*Cross-sectional View*

Top View

Cross-sectional View

*Top View*

*Cross-sectional View*

*Top View*

*Cross-sectional View*

Top View

Cross-sectional View

Top View

Cross-sectional View

Top View

Cross-sectional View

Top View

Cross-sectional View

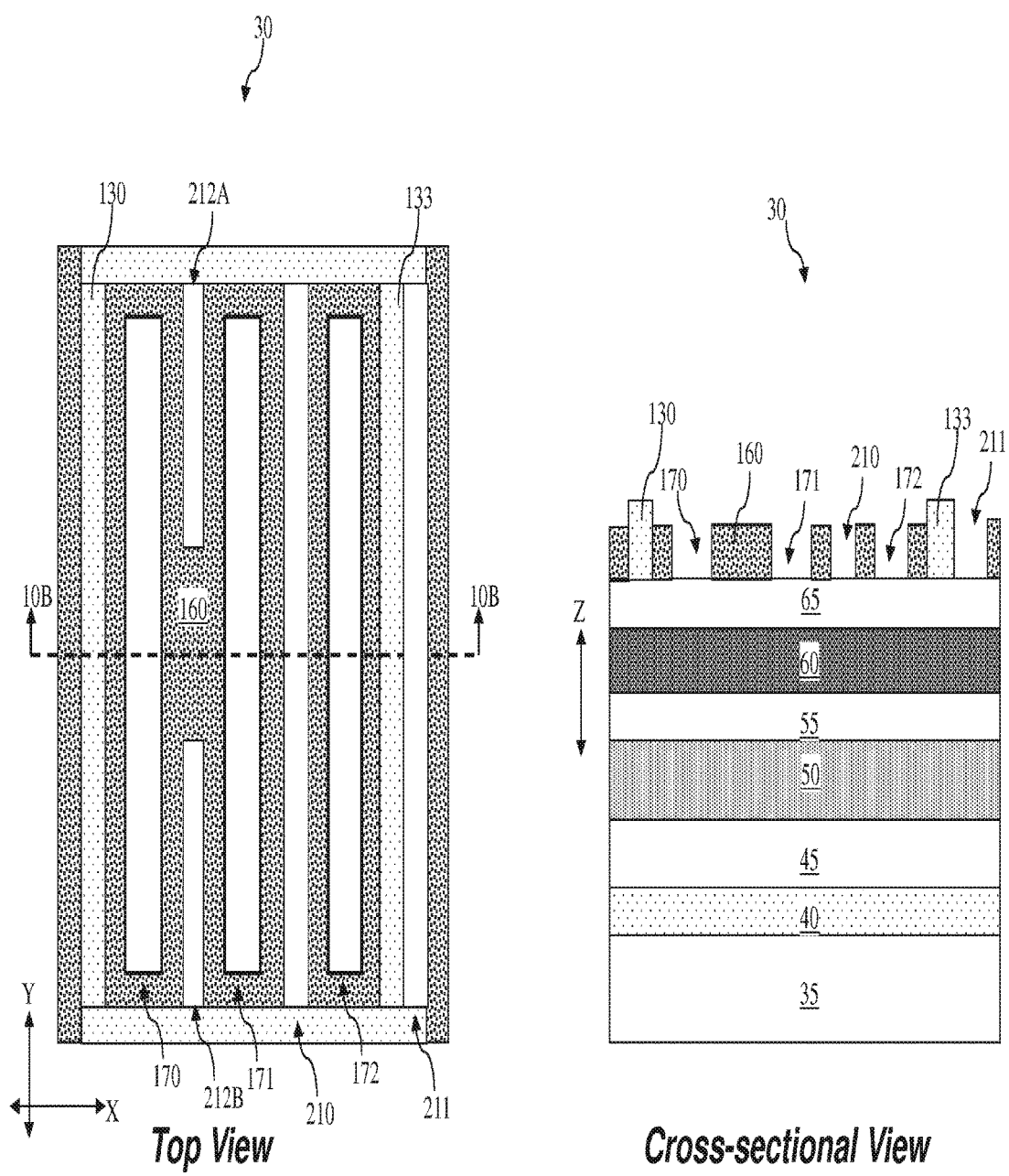
Fig. 10A Top View
Fig. 10B Cross-sectional View

Top View

Cross-sectional View

Top View

Cross-sectional View

Top View

Cross-sectional View ial_UjS 10,283,371 B2

SPACER-DAMAGE-FREE ETCHING

PRIORITY DATA

The present application is a continuation application of U.S. patent application Ser. No. 14/796,153, filed on Jul. 10, 2015, now issued as U.S. Pat. No. 9,601,346 on Mar. 21, 2017, which is a continuation application of U.S. patent application Ser. No. 14/084,744, filed on Nov. 20, 2013, now issued as U.S. Pat. No. 9,093,386 on Jul. 28, 2015, the disclosures of each of which are hereby incorporated by reference in their respective entireties.

TECHNICAL FIELD

The present disclosure relates generally to a method of patterning a semiconductor device, and more particularly, to an improved patterning technique that performs etching and protective coating deposition almost simultaneously, so as to reduce spacer damage during etching.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

The decreasing geometry sizes may lead to various manufacturing difficulties. For instance, as the device sizes become smaller and smaller, any amount of overlay shift may cause problems. As an example, spacers may be used to define metal lines in an interconnect structure. But if a sufficient overlay requirement is not met during fabrication, the spacers may become damaged during one or more etching processes. The damaged spacers may cause critical dimension uniformity issues for those metal lines, which degrades device performance and may even lead to device failures.

Therefore, while existing methods of patterning semiconductor devices have been generally adequate for their intended purposes, they have not been entirely satisfactory in every aspect.

BRIEF DESCRIPTION OF THE DRAWINGS

The present disclosure is understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A-13A are diagrammatic fragmentary top level views of a portion of a semiconductor device at different stages of fabrication in accordance with aspects of the present disclosure.

FIGS. 1B-13B are diagrammatic fragmentary cross-sectional side views of the portion of the semiconductor device of FIGS. 1A-13A at different stages of fabrication in accordance with aspects of the present disclosure.

DETAILED DESCRIPTION

Figure 2A:
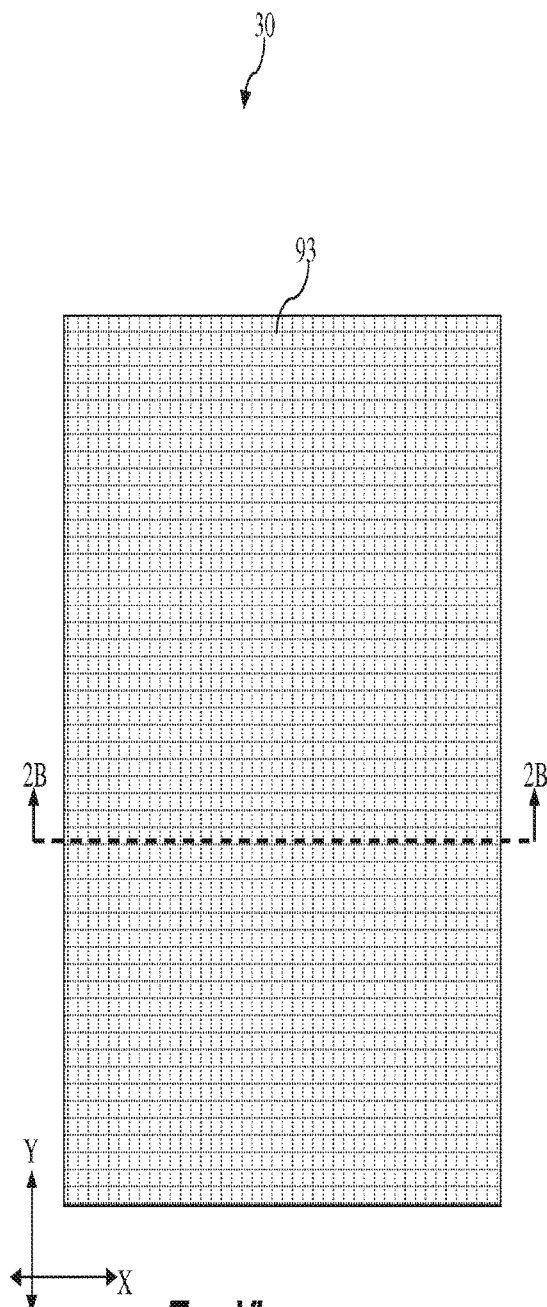

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIGS. 1A-13A are diagrammatic fragmentary top level views of a portion of a semiconductor device 30 during various patterning stages in accordance with an embodiment of the method 11 described in FIG. 1. FIGS. 1A-13A are two-dimensional views, wherein the two dimensions respectively extend along an X axis and a Y axis perpendicular to the X axis. FIGS. 1B-13B are diagrammatic fragmentary cross-sectional side views of the portion of the semiconductor device 30 observed in a direction that is along the Y axis. Alternatively stated, the cross-section is cut in the direction along the X axis. The various forming and etching processes (discussed later) performed on the semiconductor device 30 are done along a Z axis that is perpendicular to an imaginary plane formed by the X axis and the Y axis.

The semiconductor device 30 may be a portion of an integrated circuit (IC) chip and may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors. It is understood that FIGS. 1-13A and 1B-13B have been simplified for a better understanding of the inventive concepts of the present disclosure.

Referring to FIGS. 1A and 1B, the semiconductor device 30 includes a substrate 35. The substrate 35 may be a semiconductor wafer, or may be an under-layer such as a metal layer ($M_x$ to $M_{x+1}$). For example, the substrate 35 may include silicon. The substrate 35 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Alternatively, the substrate 35 may include a non-semiconductor material such as a glass substrate for thin-film-transistor liquid crystal display (TFT-LCD) devices, or fused quartz or calcium fluoride for a photomask (mask). The substrate 35 may include various doped regions and/or dielectric features for various microelectronic components, such as a complementary metal-oxide-semiconductor field-effect transistor (CMOSFET), imaging sensor, memory cell, and/or capacitive element.

A silicide-blocking layer (SBL) 40 is formed over the substrate 35. The silicide-blocking layer 40 may also be referred to as a silicidation-blocking layer. In some embodiments, the silicide-blocking layer 40 is formed by a suitable process such as physical vapor deposition (PVD), sputtering, chemical vapor deposition (CVD), atomic layer deposition (ALD), or combinations thereof. The silicide-blocking layer 40 may also serve as an etching-stop layer in various embodiments. The silicide-blocking layer 40 includes a dielectric material such as silicon oxide or silicon nitride in the present embodiment, but may include another suitable material in alternative embodiments. It is understood that in some embodiments, the silicide-blocking layer 40 may not be formed directly on the upper surface of the substrate 35. Instead, other suitable layers may be formed between the substrate 35 and the silicide-blocking layer 40.

A Tetraethyl orthosilicate (TEOS) layer 45 is formed over the silicide-blocking layer 40. In some embodiments, the TEOS layer 50 is formed by a process such as PVD, CVD, plasma enhanced chemical vapor deposition (PECVD), combinations thereof, or another suitable technique. The TEOS layer 50 improves the adhesion between the silicide-blocking layer 40 and a low-k dielectric layer to be formed over the TEOS layer 50, as discussed below.

A low-k dielectric layer 50 is formed over the TEOS layer 45. In some embodiments, the low-k dielectric layer 50 is formed by a process such as PVD, CVD, PECVD, ALD, combinations thereof, or another suitable technique. The low-k dielectric layer 50 includes a low-k material, which is a material having a dielectric constant less than that of standard silicon dioxide (dielectric constant of silicon oxide is about 3.9). In various embodiments, the low-k dielectric material may include, but is not limited to, fluorine-doped silicon dioxide, carbon-doped silicon dioxide, porous silicon dioxide, porous carbon-doped silicon dioxide, spin-on organic polymeric dielectrics, spin-on silicone based polymeric dielectric, polyimides, aromatic polymers, fluorine-doped amorphous carbon, vapor-deposited parylene, etc.

An anti-reflective coating (ARC) layer 55 is formed over the low-k dielectric layer 50. In some embodiments, the anti-reflective coating 55 is a nitrogen-free anti-reflective coating (NFARC) layer. The anti-reflective coating layer 55 may be formed by a suitable deposition technique known in the art.

A titanium nitride layer 60 is then formed over the ARC layer 55. The titanium nitride layer 60 is formed by a radio-frequency physical vapor deposition (RFPVD) process in the present embodiment, but may be formed by an alternative process in another embodiment. The titanium nitride layer 60 may serve as a hard mask layer in various embodiments.

A Tetraethyl orthosilicate (TEOS) layer 65 is then formed over the titanium nitride layer 60. In some embodiments, the TEOS layer 50 is formed by a process such as PVD, CVD, plasma enhanced chemical vapor deposition (PECVD), combinations thereof, or another suitable technique. Again, the TEOS layer 65 may improve the adhesion between the layers above and below the TEOS layer 65.

An amorphous silicon layer 70 is then formed over the TEOS layer 65. The amorphous silicon layer 70 is formed by a process such as PVD, CVD, sputtering, or another suitable technique. The amorphous silicon layer 70 herein serves as a layer to be patterned by a tri-layer photoresist (discussed below). The amorphous silicon layer 70 helps define a line A, which is discussed below in more detail.

It is understood that the layers 40-70 are merely example layers that can be patterned by a photoresist layer. In other embodiments, a subset of the layers 40-70 or different layers may be formed over the substrate 35 and may be patterned by the photoresist layer discussed below.

Figure 2B:
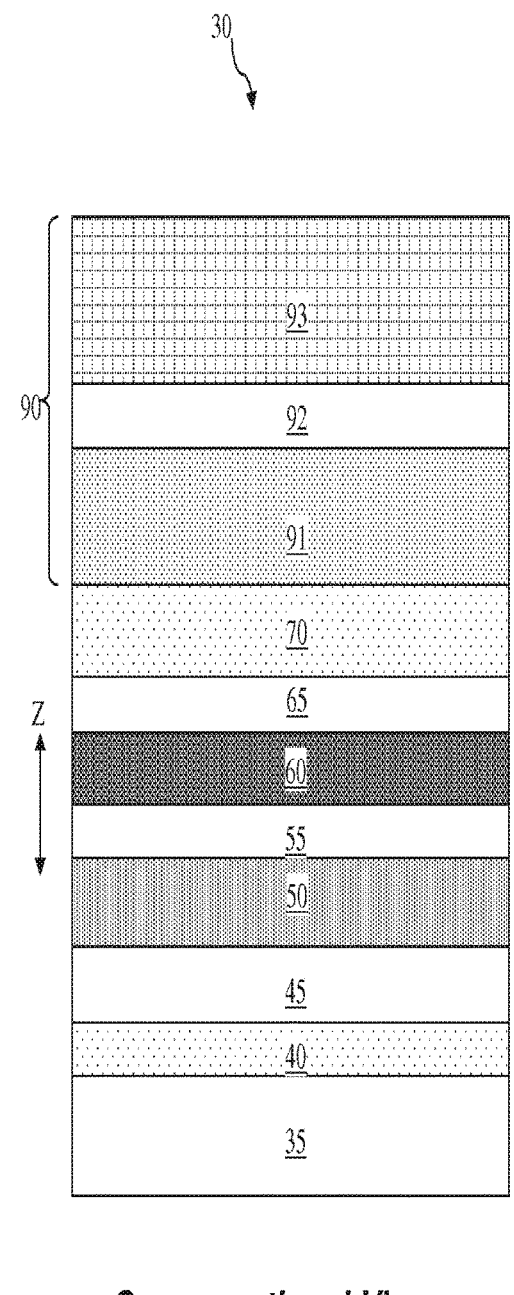

Referring now to FIGS. 2A-2B, a tri-layer photoresist 90 is formed over the hard mask layer 80. In the present embodiment, the tri-layer photoresist 90 includes a bottom layer 91, a middle layer 92, and a top layer 93. In some embodiments, the bottom layer 91 includes a $C_xH_yO_z$, material, the middle layer 92 includes a $SiC_xH_yO_z$ material, and the top layer 93 includes another $C_xH_yO_z$ material. The $C_xH_yO_z$ material of the bottom layer 91 may be identical to the $C_xH_yO_z$ material of the top layer 93 in some embodiments, but they may also be different in other embodiments. The top layer 93 also includes a photo-sensitive element, such as a photo-acid generator (PAG). Therefore, the top layer 93 may also be interchangeably referred to as a photoresist layer. The presence of the photo-sensitive element allows a photolithography process to be performed to pattern the top layer 93. It is understood that in other embodiments, one or more layers of the tri-layer photoresist may be omitted, or additional layers may be provided as a part of the tri-layer photoresist, and the layers may be formed in difference sequences.

Figure 3A:
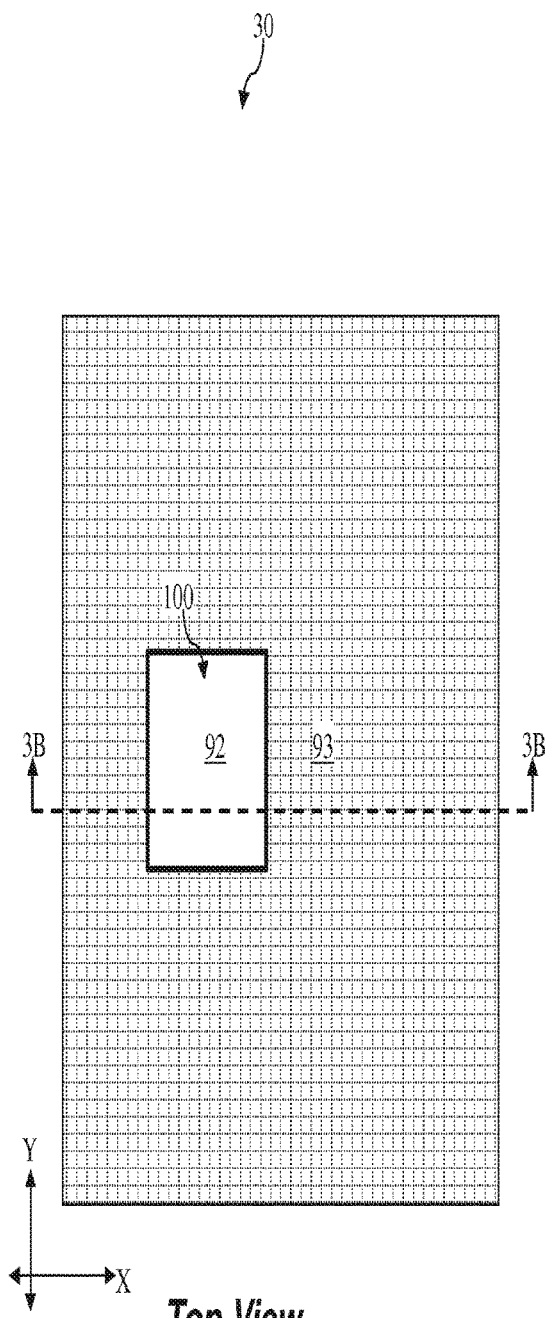
Figure 3B:
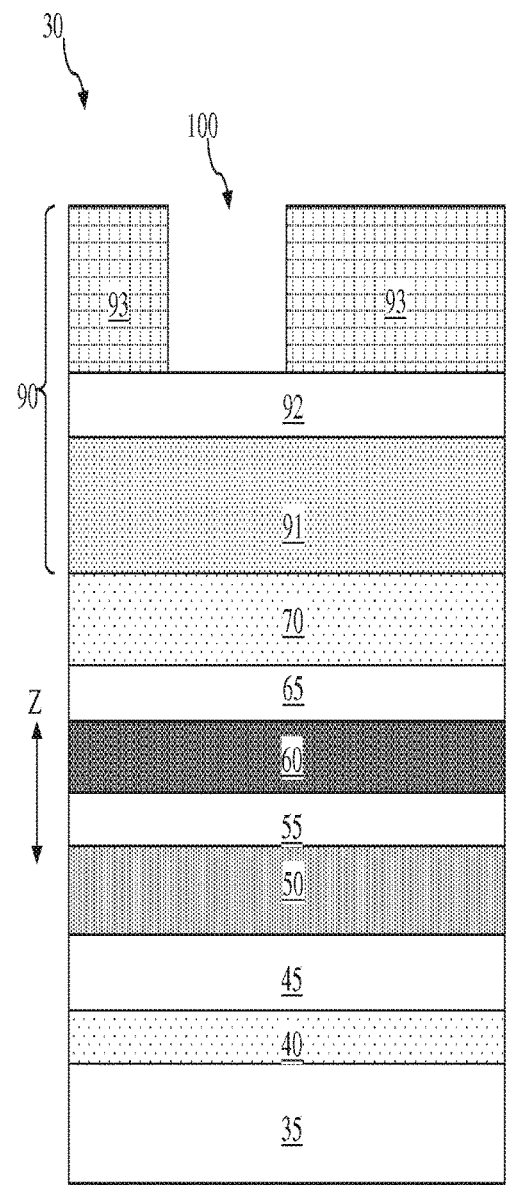

Referring now to FIGS. 3A-3B, the top layer 93 is patterned by a photolithography process, which may include one or more exposure, developing, rinsing, and baking processes (not necessarily performed in this order). The photolithography process patterns the top layer 93 into a photoresist mask, which may have one or more trenches or openings that expose the middle layer 92 therebelow. As an example, an opening 100 is illustrated in FIGS. 3A-3B herein.

Figures 4A, 4B:
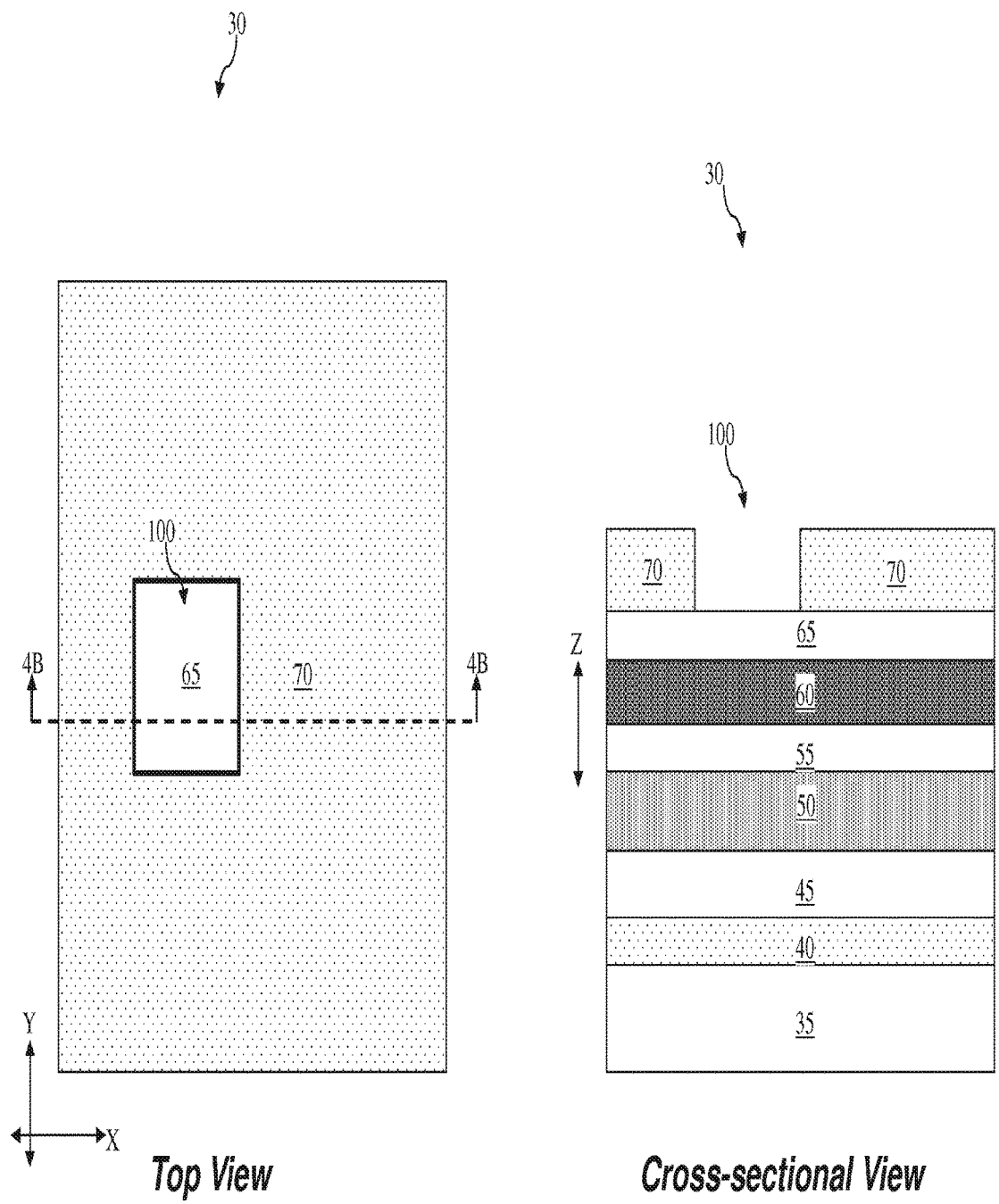

Referring now to FIGS. 4A-4B, one or more etching processes may be performed to extend the opening 100 downward. The top layer 93 is used as a mask to etch the layers therebelow. The TEOS layer 65 serves as an etching-stop layer herein. The tri-layer photoresist 90 is removed at the end of the etching process. Thus, the amorphous silicon layer 70 now contains the opening 100, which exposes a portion of the TEOS layer 65 below.

Figure 5A:
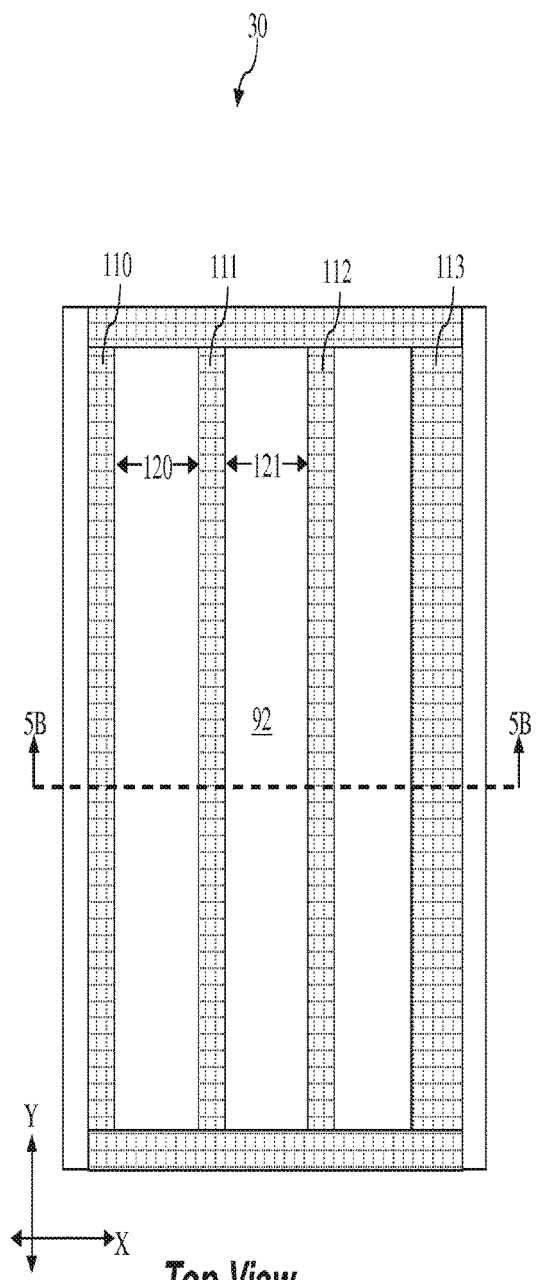
Figure 5B:
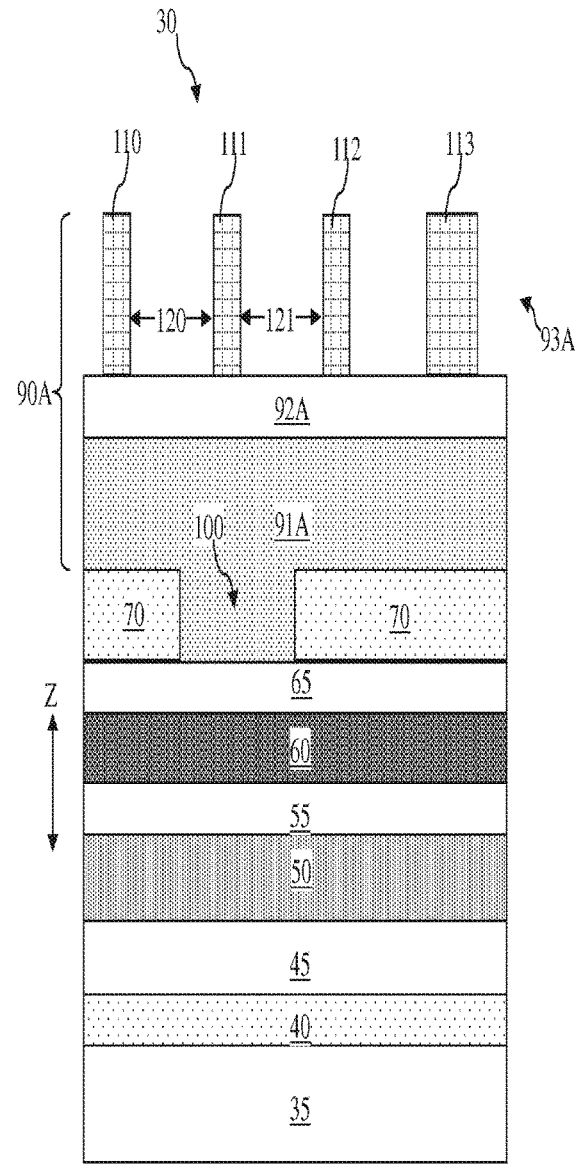

Referring now to FIGS. 5A-5B, a new tri-layer photoresist 90A is formed over the amorphous silicon layer 70 and over the TEOS layer 65. The bottom layer 91A of the tri-layer photoresist 90A fills the opening 100 defined by the amorphous silicon layer 70. The top layer 93A of the tri-layer photoresist 90 undergoes a lithography process to form a plurality of line patterns 110-113. At least one of these line patterns, for example line pattern 111, is disposed over the opening 100, which is now filled by the bottom layer 91A. In some embodiments, the line patterns 110-113 are substantially equidistant from adjacent line patterns. For example, a spacing 120 separating two of the adjacent line patterns 110-111 is substantially equal to another spacing 121 separating another two adjacent line patterns 111-112. These line patterns 110-113 define a line A of "a line A/line B" metal lines discussed below.

Figures 6A, 6B:
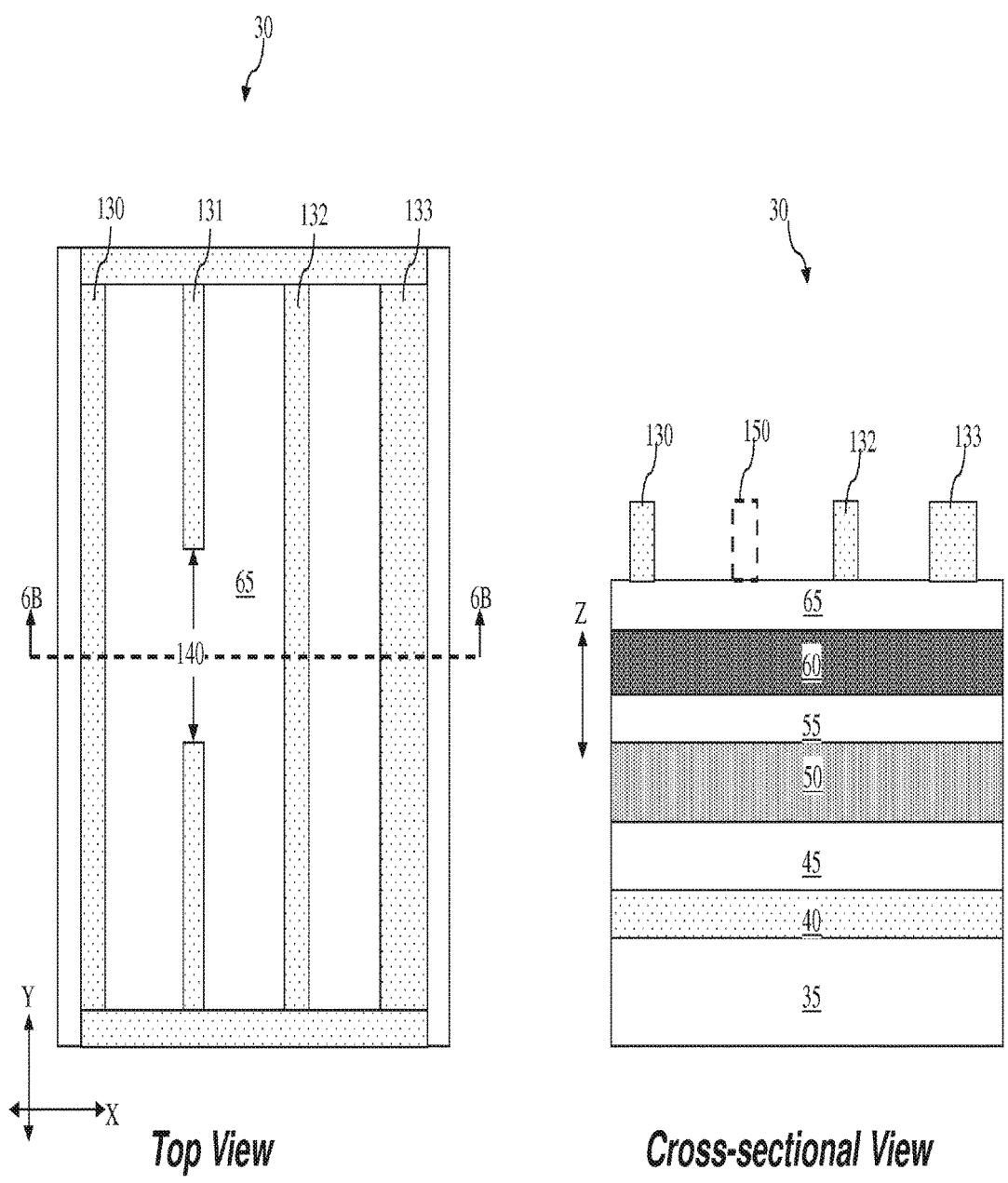

Referring now to FIGS. 6A-6B, one or more etching processes are performed to transfer the line patterns 110-113 to the amorphous silicon layer 70. In other words, the amorphous silicon layer 70 is patterned to form line patterns 130-133 that substantially preserve the lateral dimensions of the line patterns 110-113. The TEOS layer 65 serves as an etching-stop layer herein. As discussed above, the line patterns 110-113 were formed to define the line A, and thus the line patterns 130-133 also define the line A. As such, the one or more etching processes performed to form the line patterns 130-133 may also be referred to as "line A etching." Though it may not be readily apparent at this stage of fabrication, the line patterns 130-133 are formed to help define the width (or lateral dimension measured along the X direction) of metal line segments line B that will be formed in the low-k dielectric layer 50 later.

Since the amorphous silicon layer 70 had already been patterned previously (referring to FIGS. 4A-4B) to form the opening 100 (which was filled by the bottom layer 91A), the etching herein causes a "break" or a "cut" of one of the line patterns 131. This is because there is no amorphous silicon layer 70 within the opening 100, and as such the line pattern 93A cannot be fully transferred to that particular segment of the amorphous silicon layer 131. Hence, a dimension 140 of the "break" measured in the Y direction is substantially equal to the dimension of the opening 100 measured in the Y direction.

Also, since the cross-sectional view shown in FIG. 6B is taken across this break, the corresponding line pattern 131 is not illustrated in FIG. 6B. For reasons of clarity, however, a dashed outline 150 of the line pattern 131 is still shown in place of the missing line pattern 131 in FIG. 6B. Stated differently, had the cross-sectional view been taken across a different cut outside the opening 100 (i.e., not over the break of the line pattern 131), then the segment 131 would be illustrated in the corresponding cross-sectional view in place of the dashed outline 150.

Figure 7A:
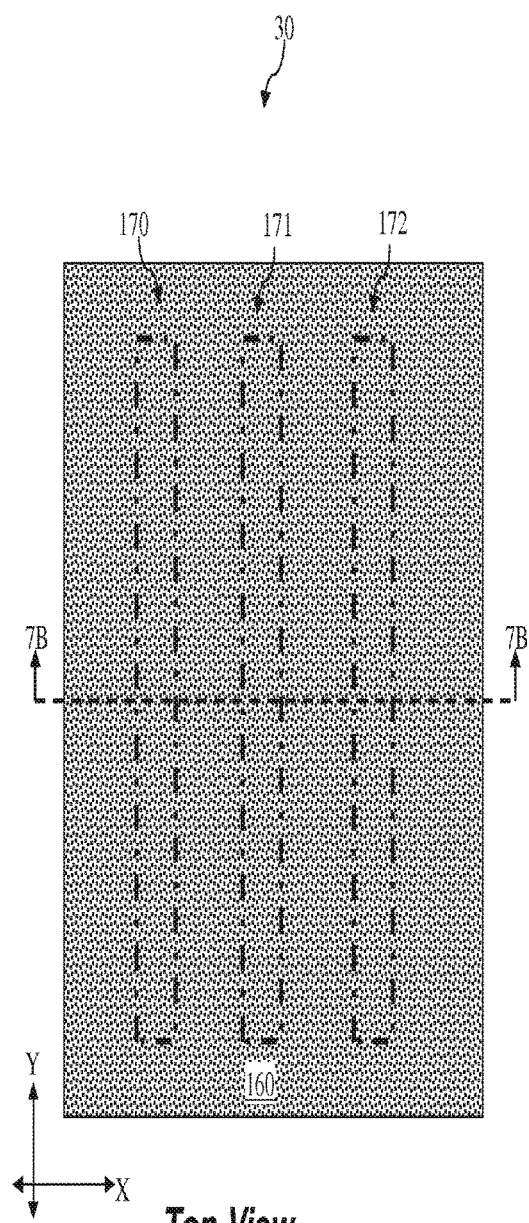
Figure 7B:
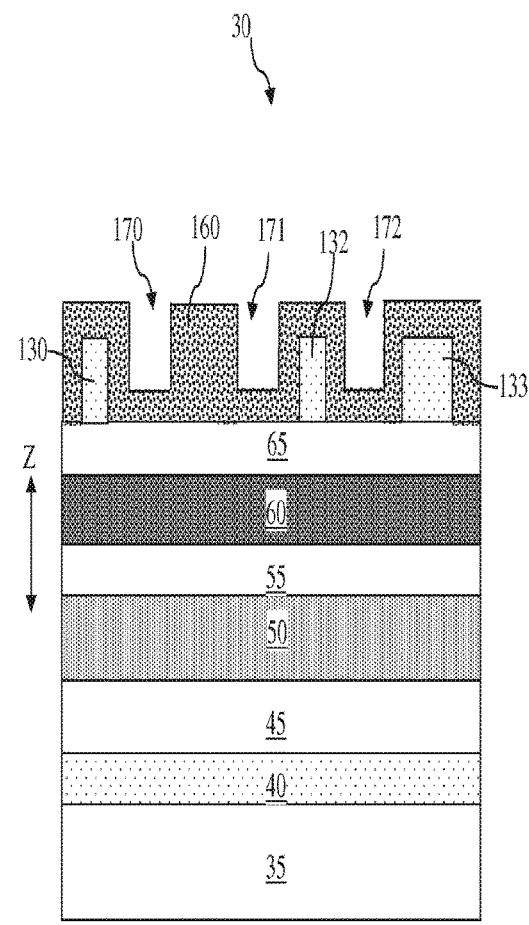

Referring now to FIGS. 7A-7B, a spacer material 160 is formed over the line patterns 130-133 and over the exposed surfaces of the TEOS layer 65. The spacer material 160 contains a dielectric material, for example titanium oxide. In some embodiments, the spacer material 160 is formed in a conformal manner. The formation of the spacer material 160 defines trenches 170-172. The outlines of these trenches 170-172 are illustrated as broken lines in the top view of FIG. 7A. Though it may not be readily apparent at this stage of fabrication, the openings 170-172 are formed to help define the width (or lateral dimension measured along the X direction) of metal line segments line A that will be formed in the low-k dielectric layer 50 later.

Figure 8A:
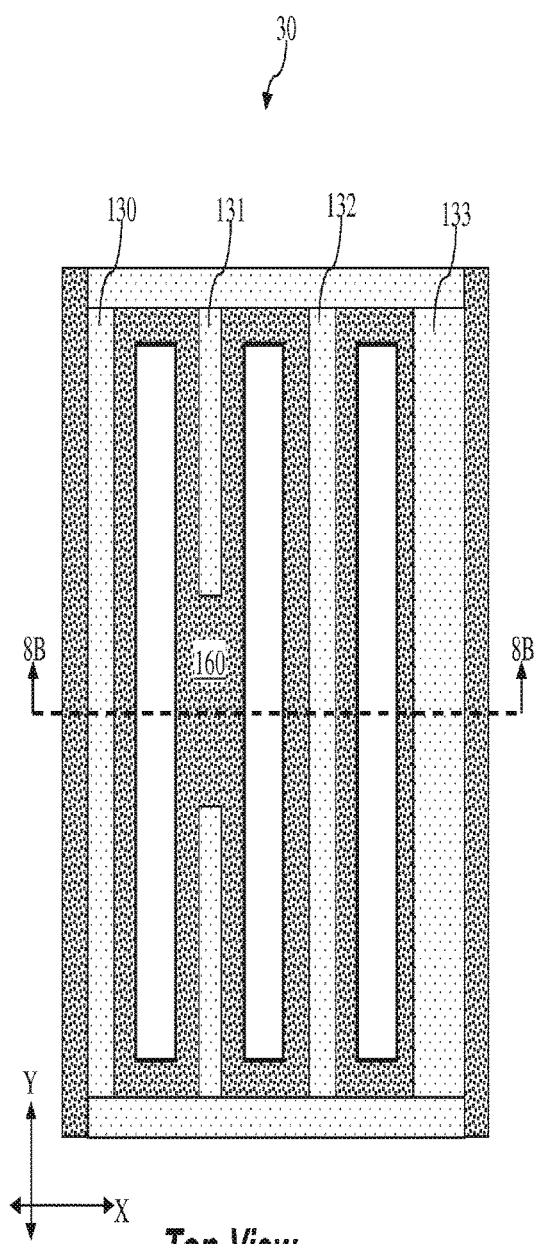
Figure 8B:
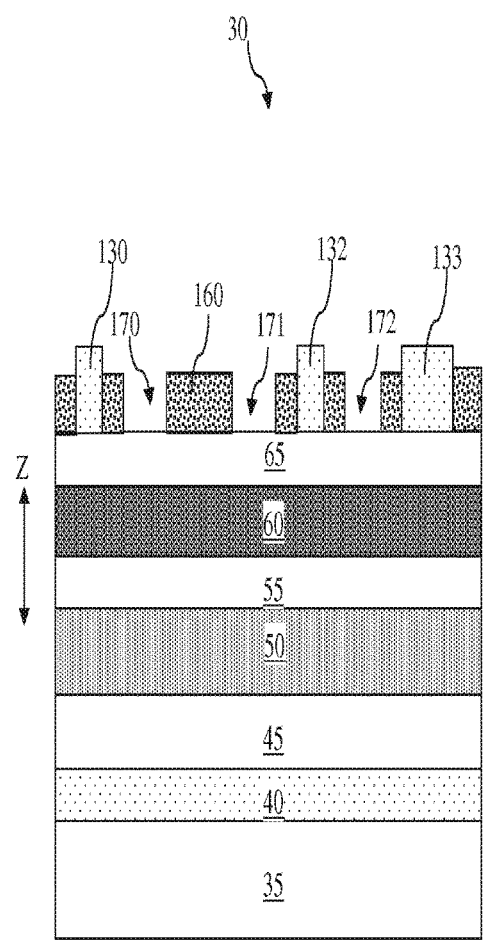

Referring now to FIGS. 8A-8B, an etching process is performed to etch the spacer material 160. The top surfaces of the line patterns 130-133 are exposed by the removal of the spacer material 160 formed thereon. Hence, the line patterns 130-133 are now visible in the top view of FIG. 8A. The portions of the spacer material 160 disposed within the trenches 170-172 are also removed, thereby exposing portions of the TEOS layer 65. In other words, the etching process effectively extends the trenches 170-172 downward until the TEOS layer 65 is exposed.

Figure 9A:
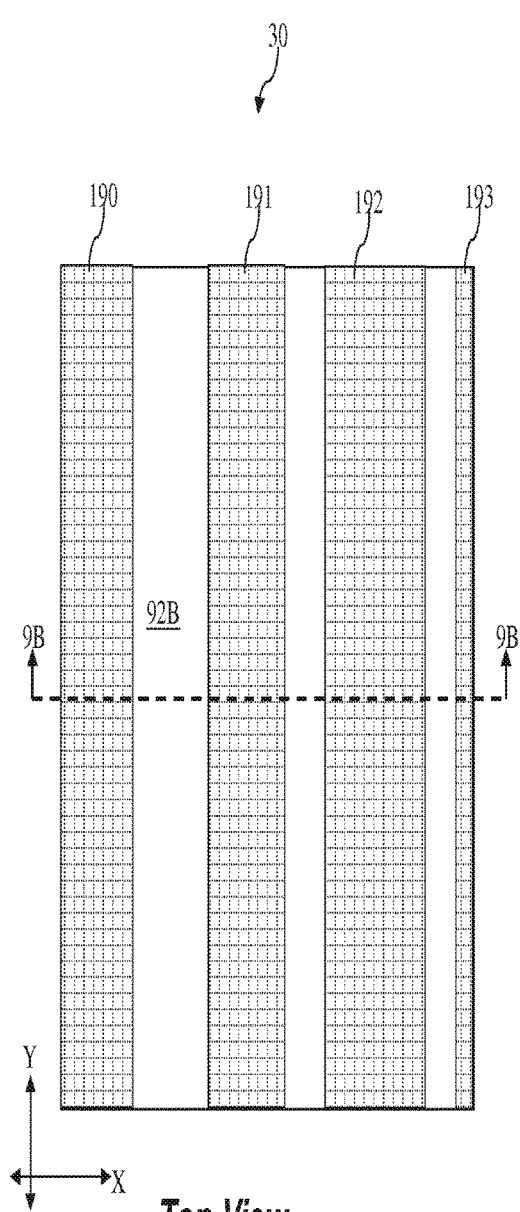
Figure 9B:
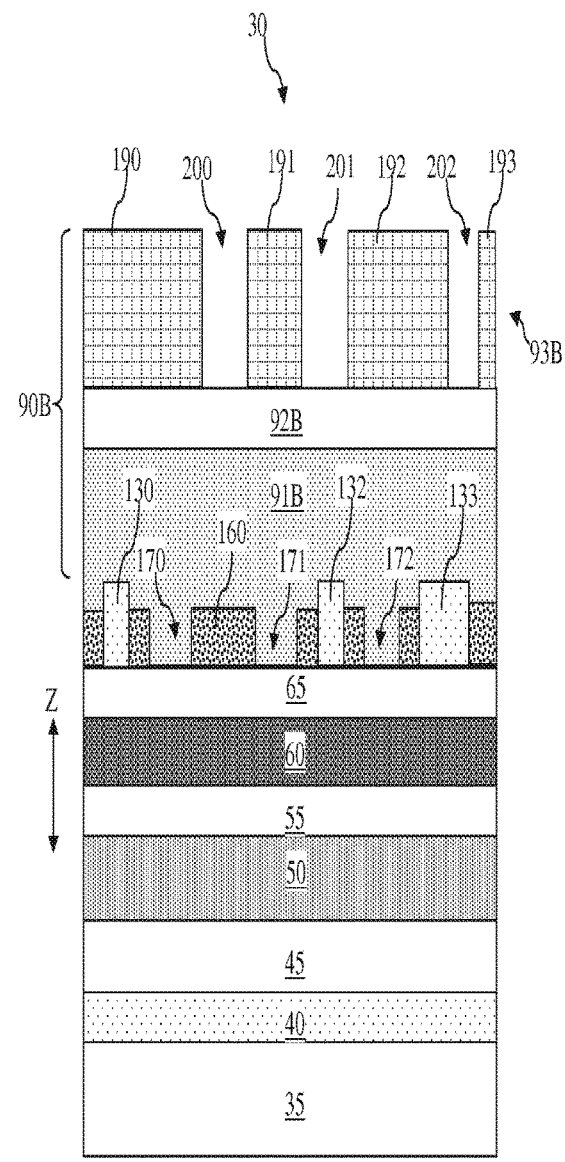

Referring now to FIGS. 9A-9B, another tri-layer photoresist 90B is formed over the line patterns 130-133, the spacer material 160, and the TEOS layer 65. The bottom layer 91B of the tri-layer photoresist 90B fills the trenches 170-172. The top layer 93B of the tri-layer photoresist 90B undergoes a lithography process to form a plurality of segments 190-193. Openings 200, 201, and 202 separate segments 190-191, 191-192, and 192-193, respectively. The opening 202 is disposed over a portion (but not all) of the line pattern 133. In a subsequent etching process, the line pattern 133 will be trimmed through the opening 202. The opening 201 is disposed over the line pattern 132. Thus, the line pattern 132 will be removed in the subsequent etching process. Similarly, the opening 200 is disposed over the line pattern 131. However, this is not readily apparent in the cross-sectional view of FIG. 9B, since the line pattern 131 cannot be illustrated in FIG. 9B due to the placement of the cross-sectional cut.

Referring now to FIGS. 10A-10B, one or more etching processes are performed to etch portions of the middle layer 92B and the bottom layer 91B under the openings 200-202. According to the various aspects of the present disclosure, as the bottom layer 91B is being etched, a polymer material is being continuously deposited on the surfaces of the etched recess in the bottom layer 91B, as well as on the exposed surfaces of the spacer material 160 and on the exposed surfaces of the line patterns 130-133. In certain embodiments, the etching of the bottom layer 91B and the polymer deposition are performed based on a Radio Frequency (RF) power pulsing function, where etching occurs when the RF power is on, and the polymer deposition occurs when the RF power is off. The RF power pulsing has a high frequency, and as such the etching and the polymer deposition are performed in short cycles. To a human user, it is as if the etching of the bottom layer 91B and the polymer deposition on the etched surfaces occur almost simultaneously. This substantially "simultaneous" etching and polymer deposition helps enlarge the overlay and clearance window in lithography and improves critical dimension uniformity (CDU) and after etching inspection (AEI) thickness control, as will be discussed in more detail below.

Returning to FIGS. 10A-10B, the etched bottom layer 91B serves as a mask for the layers below in another etching process. Essentially, the amorphous silicon layer 70 (from which the line patterns 130-133 are formed) is being patterned. This patterning process removes the line pattern 132 and a portion of the line pattern 133 (both shown in FIG. 9B). Consequently, an opening 210 is formed by the removal of the line pattern 132, and another opening 211 is formed by the partial removal of the line pattern 133. In addition, the removal of the line pattern 131 (shown in FIG. 8A, which was the line that had been cut (or broken) in the previous processes) causes openings 212A and 212B to form in place of the removal of the broken line pattern 131. This is illustrated in the top view of FIG. 10A, but not in the cross-sectional view of FIG. 10B because the cross-sectional view is not taken at either of the openings 212A and 212B.

After the patterning of the amorphous silicon layer 70 (i.e., the line patterns 130-133), the bottom layer 91B is removed, along with the polymer coating formed on its etched surfaces. At this point, the semiconductor device 30 achieves the views shown in FIGS. 10A-10B. Thus, the transition of the semiconductor device 30 from the views shown in FIGS. 9A-9B to the views shown in FIGS. 10A-10B actually involves a plurality of different processes. These processes and their corresponding views of the semiconductor device 30 will be illustrated in FIGS. 14-17 and discussed in detail below.

Figure 11A:
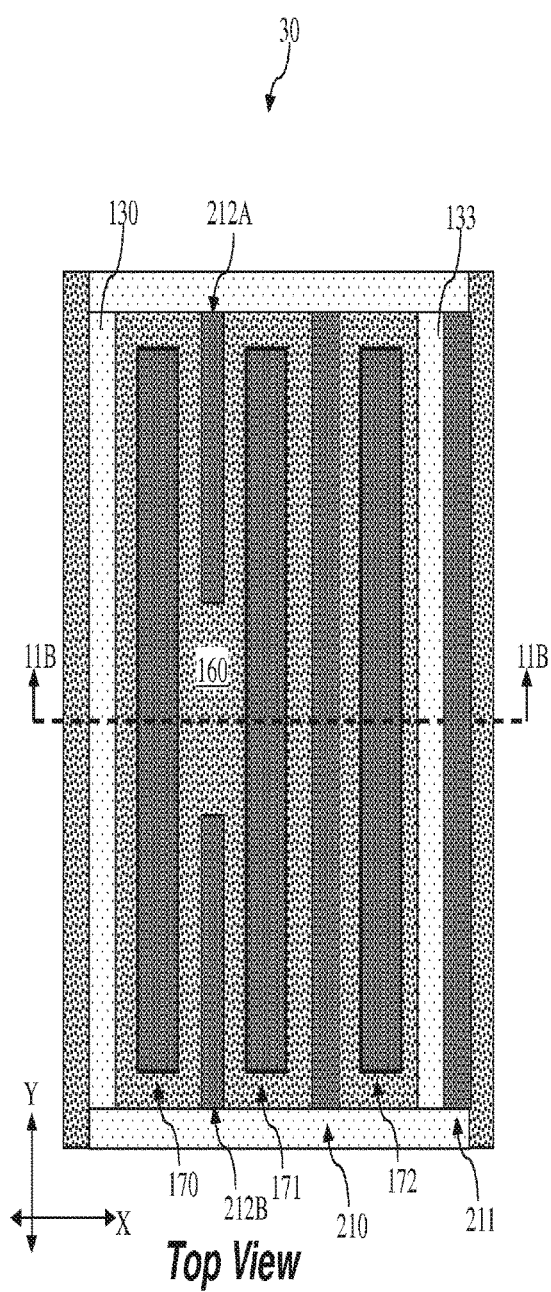
Figure 11B:
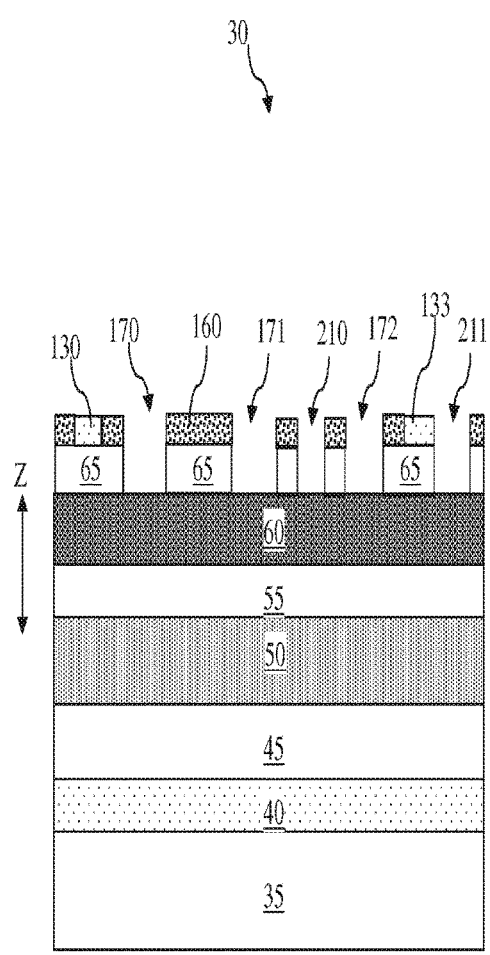

Referring now to FIGS. 11A-11B, another etching process is performed to etch the openings 170-172 and 210-212 downward until portions of the titanium nitride layer 60 are exposed. In other words, the openings 170-172 and 210-212 now extend through the TEOS layer 65. The height of the spacer material 160 and the line patterns 130 and 133 are also reduced during this etching process, as shown in FIG. 11B.

Figure 12A:
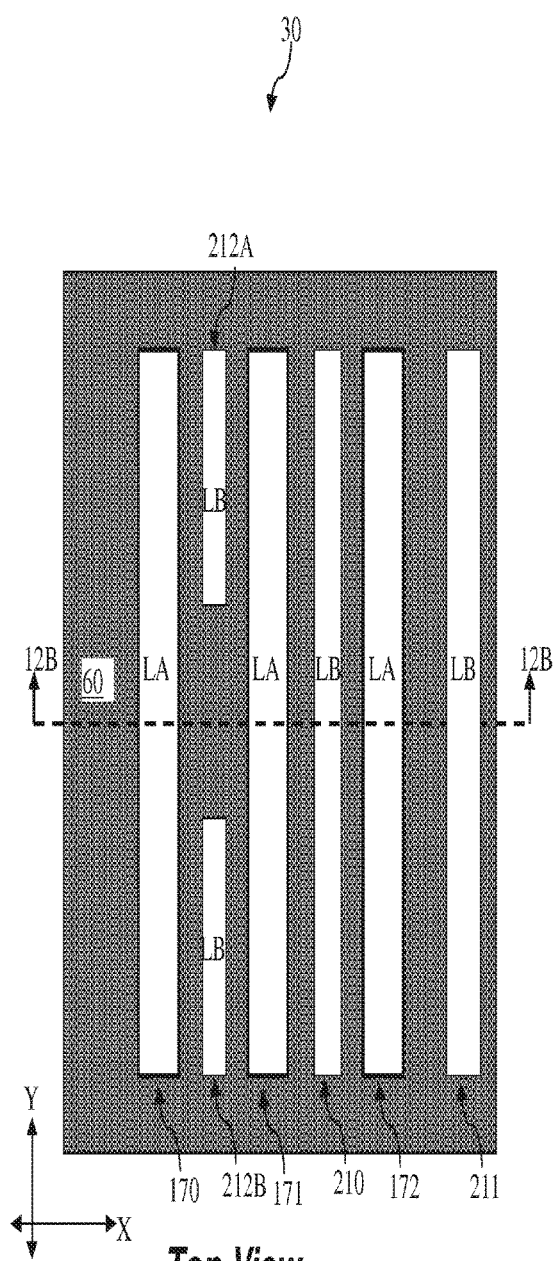
Figure 12B:
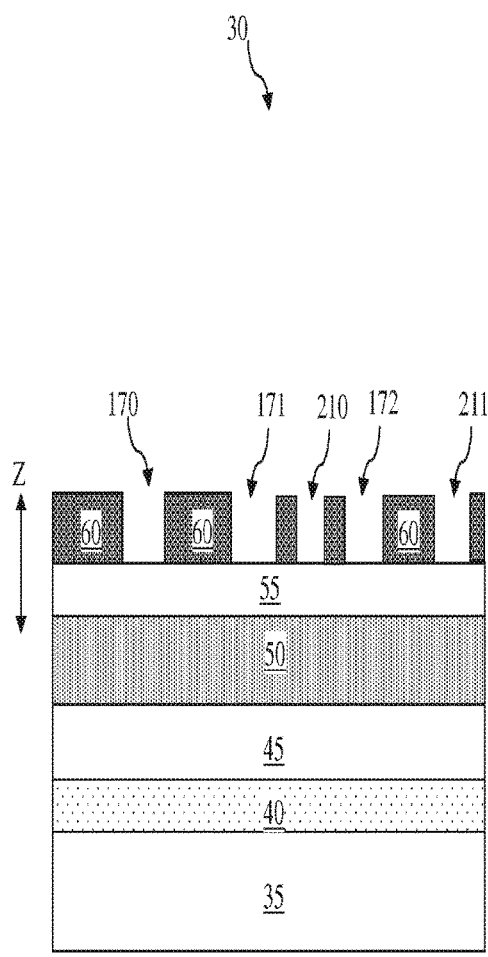

Referring now to FIGS. 12A-12B, another etching process is performed to etch the openings 170-172 and 210-212 downward until portions of the anti-reflective coating layer 55 are exposed. In other words, the openings 170-172 and 210-212 now extend through the titanium nitride layer 60. The spacer material 160 and the line patterns 130 and 133 are removed by this etching process, or are removed in a separate etching process. As shown in FIG. 12A, the openings 170, 171, and 172 define different segments of line A (LA), and the openings 212A/212B, 210, and 211 define different segments of line B (LB). The segments of line A interleave with the segments of line B. Note that in many embodiments, the widths (measured in the X direction shown in FIG. 12A) of line. A and line B are configured to be substantially equal to one another, for example within a few percentage points less than a percentage point. For reasons of simplicity, however, this is not specifically illustrated in FIG. 12A. In other words, the widths of the line A and line B segments may appear to be unequal in FIG. 12A, but they may actually be substantially equal to one another in various embodiments.

Figures 13A, 13B:
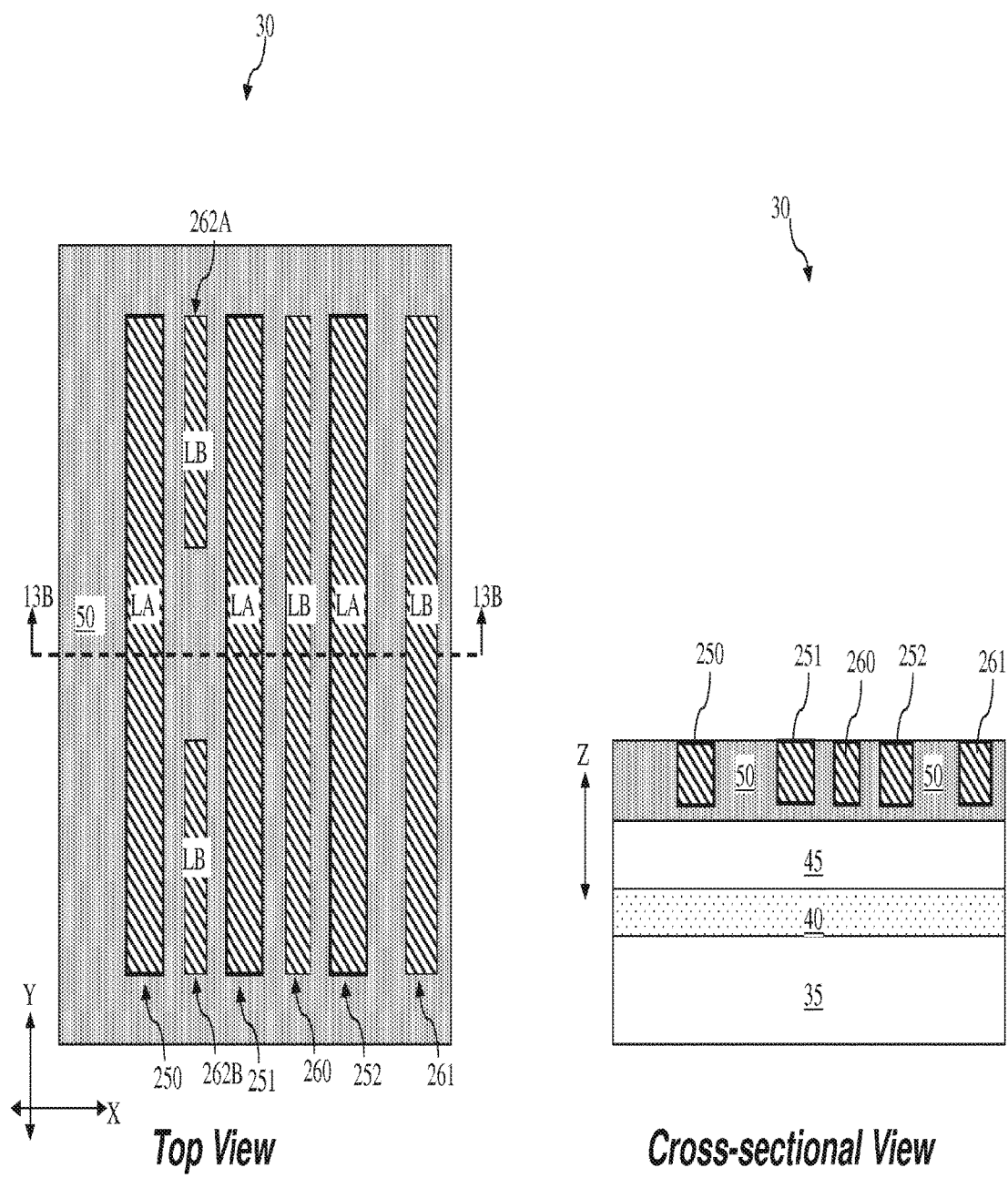

Referring now to FIGS. 13A-13B, one or more etching, removing, and deposition processes are performed to form a plurality of line A elements 250, 251, 252 and line B elements 260, 261, and 262A-262B. In more detail, the openings 170-172 and 210-212A/B are etched downwards such that they extend into, but not completely through, the low-k dielectric layer 50. The remaining portions of the titanium nitride layer 60 are then removed. A corner rounding process may be performed to round the corners of the anti-reflective layer 55. Thereafter, a deposition process may be formed to fill the openings 170-172 and 210-212A/B (now disposed in the low-k dielectric layer 50) with a conductive material, such as copper or aluminum, or alloys thereof. A polishing process such as a chemical mechanical polishing (CMP) process may then be performed to remove the excess conductive material outside the openings 170-172 and 210-212A/B and to planarize the surfaces of the conductive material and the low-k dielectric layer 50. The remaining portions of the conductive material in the openings 170-172 and 210-212A/B form the line A elements 250-252 and line B elements 260-262A/B. In some embodiments, the line A elements 250-252 and line B elements 260-262A/B elements are metal lines or interconnect features in an interconnect structure. For example, they may be used to electrically interconnect various microelectronic circuit components formed in or over the substrate 35.

FIGS. 14-17 are cross-sectional views of an embodiment of the semiconductor device 30 at different stages of fabrication. In more detail, FIGS. 14-17 are cross-sectional views that illustrate in detail the various processes performed to transition the semiconductor device 30 from FIG. 9 to FIG. 10. Among these processes, the present disclosure involves a bottom layer etching process combined with a polymer deposition process that occur almost simultaneously, as discussed above.

Figure 14:
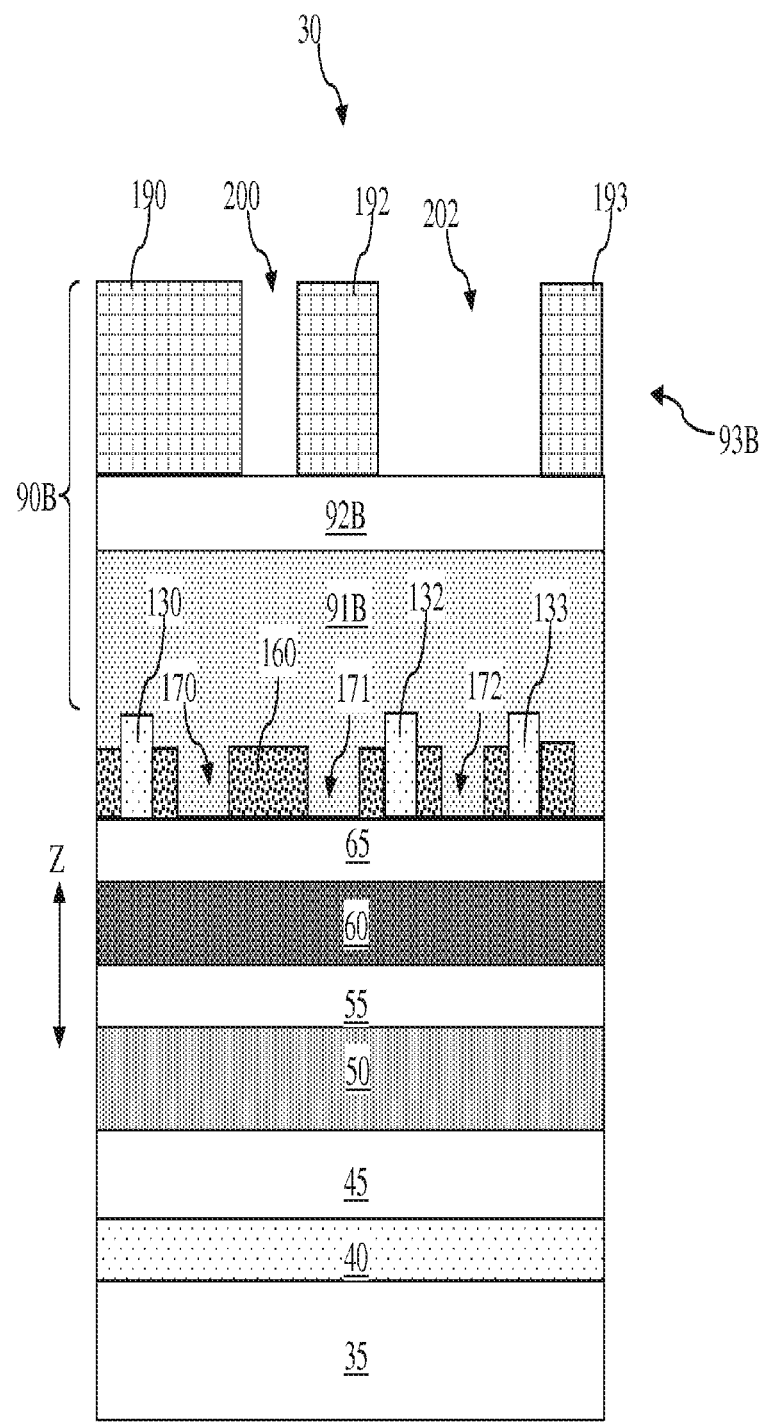
FIGS. 14-17 are diagrammatic cross-sectional side views of a portion of a semiconductor device at different stages of fabrication in accordance with various aspects of the present disclosure.

Referring to FIG. 14, the embodiment of the semiconductor device 30 is substantially similar to the one illustrated in FIG. 9. Therefore, similar components in FIG. 14 and FIG. 9 are labeled the same for reasons of clarity and consistency. However, the opening 202 has been widened to better illustrate the various aspects of the present disclosure. The widening of the opening 202 represents an undesirable scenario in fabrication where a large overlay error or shift exists. Due to this large overlay error, the spacer material 160 underneath the opening 202 will suffer undesirable damage during etching of the photoresist layer etching of the bottom layer 91B). The spacer damage may enlarge the critical dimension of the line A element (such as the line A element 252) to be formed in the low-k dielectric layer 50. Accordingly, the margin for the overlay shift may be quite stringent to prevent the spacer damage. However, the stringent overlay margin requirements may not be realistic or may too burdensome to implement.

Figure 15:
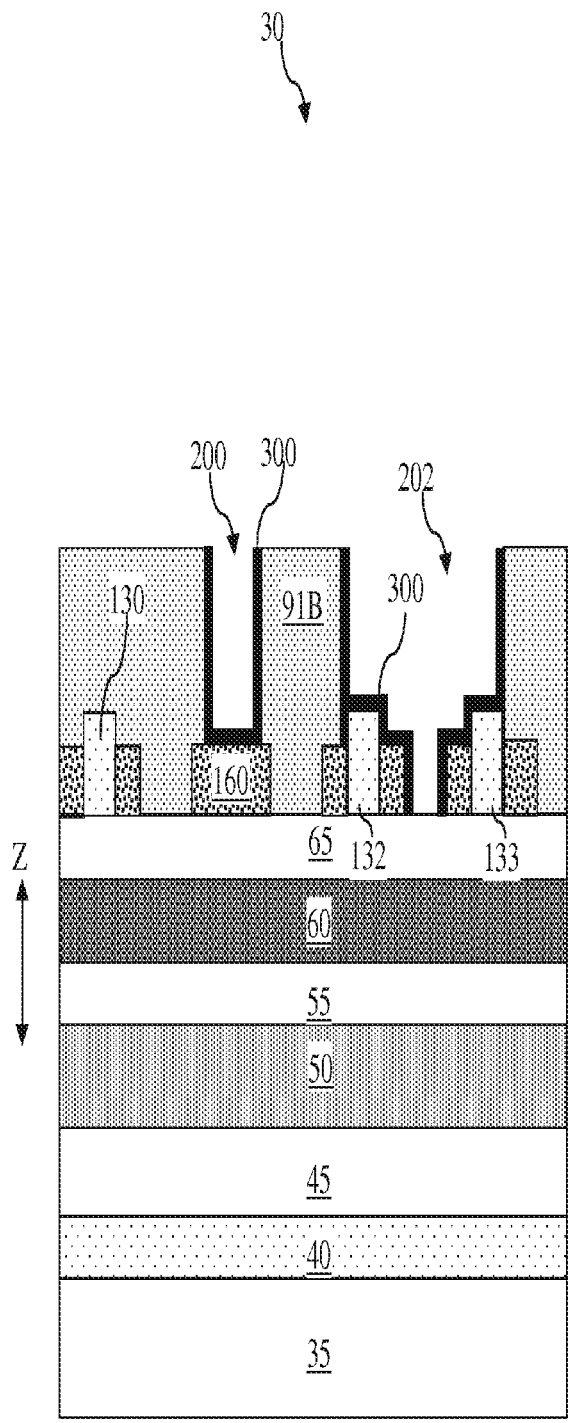

The present disclosure allows the overlay shift margin to be relaxed by forming a polymer material to protect the spacer material 160. Referring now to FIG. 15, the middle layer 92B and the bottom layer 91B of the tri-layer photoresist 90B are etched while the top layer 93B serves as a mask. The openings 200 and 202 are extended downwards into the bottom layer 91B. The middle layer 92B is removed in a flushing process. While the bottom layer 91B is being etched, a polymer material 300 is being deposited onto the exposed surfaces within the openings 200 and 202. Namely, the polymer material 300 is deposited onto the side surfaces of the bottom layer 91B, the top surfaces of the line patterns 130, 132, and 133, and the top and side surfaces of the spacer material 160.

In some embodiments, the etching process and the polymer deposition process are performed in a chamber with an RF power pulsing function. When the RF power is on, etching is performed. When the RF power is off, polymer deposition is performed. Thus, the etching and polymer deposition are completed via a plurality of pulsing cycles, where each cycle includes an etching step and a deposition step.

In some embodiments, the pulsing frequency is in a range from about 100 Hertz (Hz) to about 5000 Hz. Due to this fast pulsing frequency, it is as if the etching and the polymer deposition are occurring almost simultaneously. To a human user, it appears that the polymer material is being continuously deposited on the exposed surfaces of the layers as they are being etched. Strictly speaking, however, the etching and polymer deposition are performed sequentially in very fast cycles. Thus, the "continuous" deposition of the polymer material is actually interrupted in very fast and short time segments. But the polymer deposition is continuous in the sense that it takes place throughout the process in which the bottom layer is opened.

In some embodiments, the etching condition is as follows: a pressure in a range from about 10 milli-Torrs (mT) to about 50 mT, a top coil power in a range from about 100 Watts (W) to about 1200 W, a bias voltage in a range from about 100 volts (V) to about 1200 V, a temperature in a range from about 25 degrees Celsius to about 60 degrees Celsius, an etching gas that includes one or more of the following: $CF_4$, $H_2$, $N_2$, Ar, $CH_3F$, $CH_2F_2$, $C_4F_6$, and a flow rate in a range from about 10 standard cubic centimeters per minute (sccm) to about 500 sccm. In some embodiments, the polymer deposition process involves using a deposition gas that includes one or more of the following: $CH_3F$, $CH_2F_2$, $C_4F_6$, or another suitable polymer-rich gas. In some embodiments, a thickness of the polymer material is formed to be in a range from about 5 angstroms to about 30 angstroms.

It is understood that although polymer is being used as an example to protect the spacer material 160 herein, other suitable materials may be deposited instead of the polymer material in alternative embodiments to protect the spacer material 160.

Figure 16:
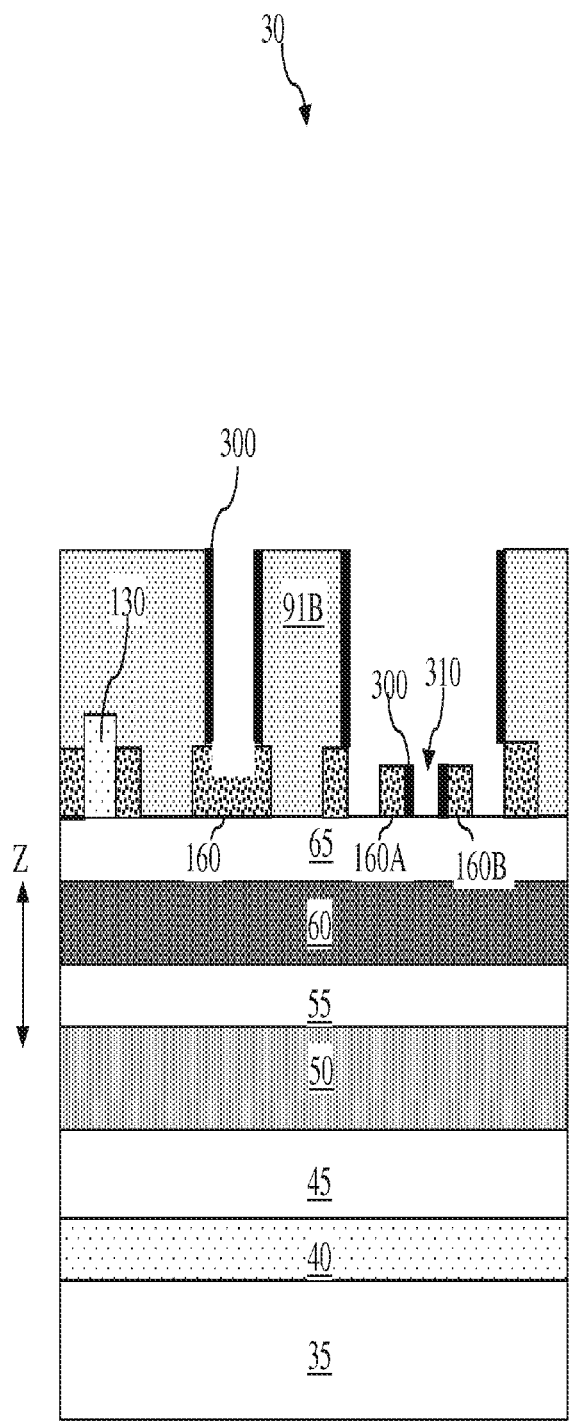

Referring now to FIG. 16, the line patterns 132-133 (i.e., formed from the amorphous silicon layer 70) are removed, for example in one or more etching processes. The etching process also causes damage to the spacer material 160, including spacer segments 160A and 160B that define an opening 310. Thus, had the polymer material 300 not been formed, the damage caused to the spacer segments 160A-

160B would have enlarged the opening 310, thereby mining the critical dimension for the line A feature to be formed below the opening 310 later. Here, since the polymer material 300 has been formed on the sidewalls of the spacer segments 160A and 160B, the removal of the line patterns 132-133 does not substantially affect the width or lateral dimension of the opening 310. In other words, the critical dimension of the line A feature can be maintained even when a bad overlay error exists. Hence, the present disclosure allows for a greater overlay and clearance window.

Figure 17:
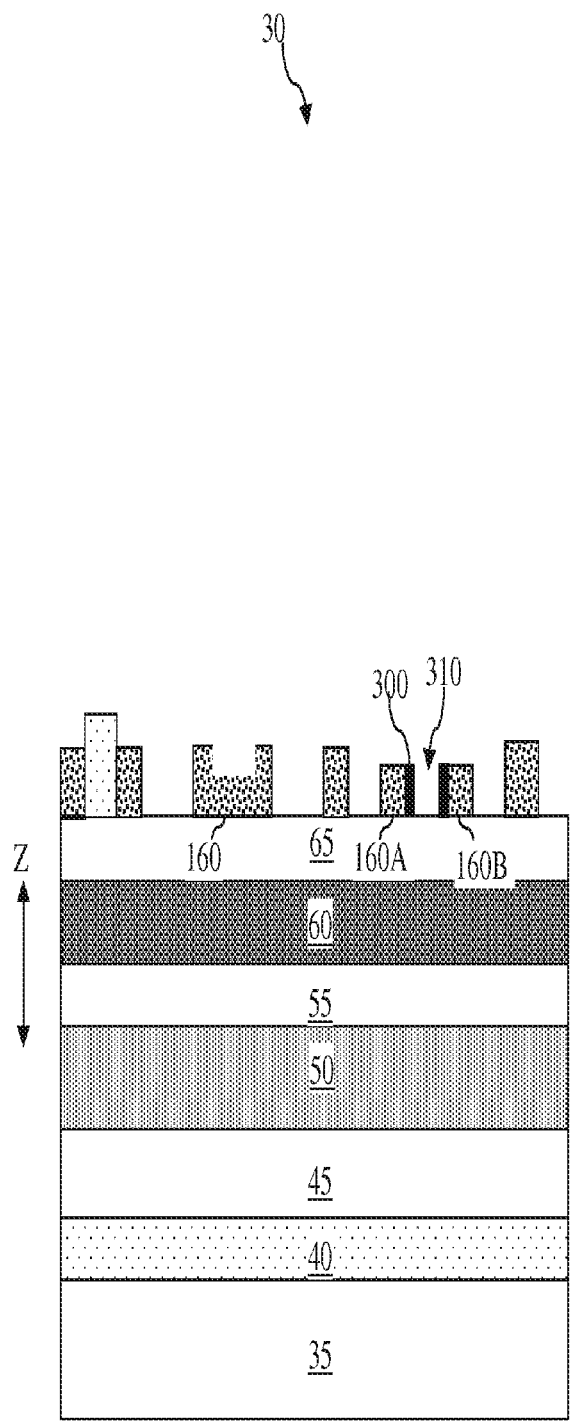

Referring now to FIG. 17, the bottom layer 91B is removed. The polymer material 300 that are disposed on the sidewall surfaces of the bottom layer 91B is also removed along with the removal of the bottom layer 91B. However, the polymer material 300 formed on the sidewall surfaces of the spacer segments 160A-160B still remain, thereby maintaining the critical dimension (i.e., the width) of the opening 310.

Figure 18:
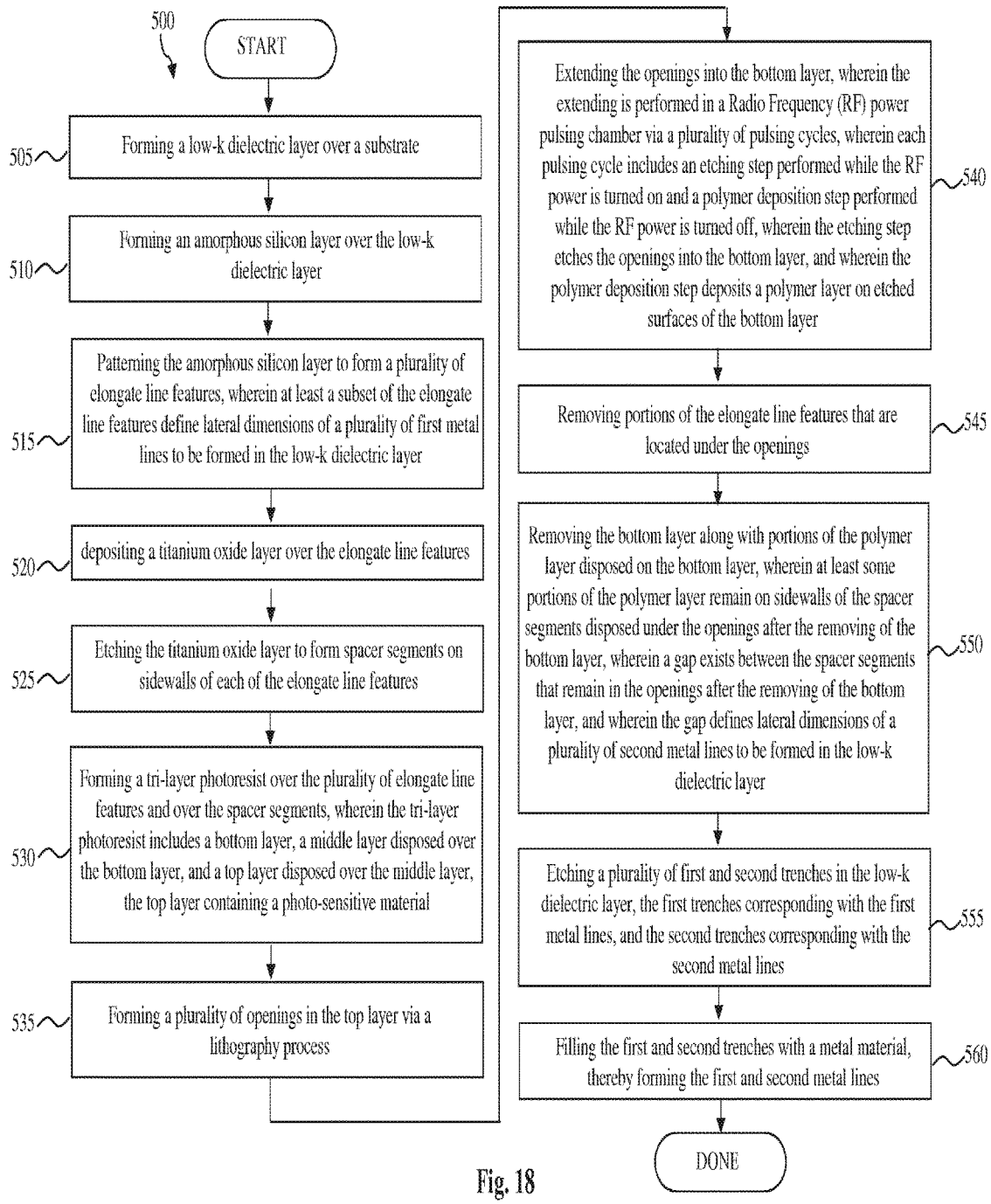
FIG. 18 is a flow chart of a method for patterning a semiconductor device in accordance with aspects of the present disclosure.

FIG. 18 is a flowchart of a method 500 for patterning a semiconductor device according to the various aspects of the present disclosure. The method 500 includes steps 505-560 in the illustrated embodiment. At step 505, a low-k dielectric layer is formed over a substrate. At step 510, an amorphous silicon layer is formed over the low-k dielectric layer. At step 515, the amorphous silicon layer is patterned to form a plurality of elongate line features. At least a subset of the elongate line features define lateral dimensions of a plurality of first metal lines to be formed in the low-k dielectric layer. At step 520, a titanium oxide layer is deposited over the elongate line features. At step 525, the titanium oxide layer is etched to form spacer segments on sidewalls of each of the elongate line features. At step 530, a tri-layer photoresist over is formed the plurality of elongate line features and over the spacer segments. The tri-layer photoresist includes a bottom layer, a middle layer disposed over the bottom layer, and a top layer disposed over the middle layer. The top layer contains a photo-sensitive material.

At step 535, a plurality of openings is formed in the top layer via a lithography process. At step 540, the openings are extended into the bottom layer. The extending of the opening is performed in a Radio Frequency (RF) power pulsing chamber via a plurality of pulsing cycles. Each pulsing cycle includes an etching step performed while the RF power is turned on and a polymer deposition step performed while the RF power is turned off. The etching step etches the openings into the bottom layer. The polymer deposition step deposits a polymer layer on etched surfaces of the bottom layer. In some embodiments, a frequency of the pulsing cycles is in a range from about 100 Hertz (Hz) to about 5000 Hz. In some embodiments, the polymer deposition step is performed such that the polymer layer is formed to have a thickness in a range from about 5 angstroms to about 30 angstroms.

At step 545, portions of the elongate line features that are located under the openings are removed. At step 550, the bottom layer is removed along with portions of the polymer layer disposed on the bottom layer. At least some portions of the polymer layer remain on sidewalls of the spacer segments disposed under the openings after the removing of the bottom layer. A gap exists between the spacer segments that remain in the openings after the removing of the bottom layer. The gap defines lateral dimensions of a plurality of second metal lines to be formed in the low-k dielectric layer. At step 555, a plurality of first and second trenches is etched in the low-k dielectric layer. The first trenches correspond with the first metal lines, and the second trenches correspond with the second metal lines. At step 560, the first and second trenches are filled with a metal material, thereby forming the first and second metal lines.

It should be noted that additional processes may be provided before, during, and after the method 500 of FIG. 18, and that some other processes may only be briefly described herein for reasons of simplicity.

One aspect of the present disclosure involves a method of fabricating a semiconductor device. The method includes: forming a tri-layer photoresist over a plurality of patterned features, wherein the tri-layer photoresist includes a bottom layer, a middle layer disposed over the bottom layer, and a top layer disposed over the middle layer, the top layer containing a photo-sensitive material; patterning the top layer via a photolithography process, the patterned top layer including an opening; extending the opening into the bottom layer, wherein the extending comprises etching the bottom layer and continuously forming a protective layer on etched surfaces of the bottom layer and on exposed surfaces of the patterned features; and removing the bottom layer, wherein at least some portions of the protective layer remain on the exposed surfaces of the patterned features after the bottom layer is removed.

Another aspect of the present disclosure involves a method of fabricating a semiconductor device. The method includes: forming a low-k dielectric layer over a substrate; forming a patternable layer over the low-k dielectric layer; patterning the patternable layer to form a plurality of line features; forming spacer elements on sidewalls of each of the line features; forming a tri-layer photoresist over the plurality of line features and over the spacer elements, wherein the tri-layer photoresist includes a bottom layer, a middle layer disposed over the bottom layer, and a top layer disposed over the middle layer, the top layer containing a photo-sensitive material; patterning the top layer into a mask having a plurality of openings; extending the openings into the bottom layer, wherein the extending is performed in a Radio Frequency (RF) power pulsing chamber via a plurality of pulsing cycles, wherein each pulsing cycle includes an etching step and a polymer deposition step, wherein the etching step etches the openings into the bottom layer, and wherein the polymer deposition step deposits a polymer layer on etched surfaces of the bottom layer; removing portions of the line features that are disposed under the openings; and thereafter removing the bottom layer, wherein at least some portions of the polymer layer remain on sidewalk of the spacer elements disposed under the openings after the bottom layer has been removed.

Yet another aspect of the present disclosure involves a method of fabricating a semiconductor device. The method includes: forming a low-k dielectric layer over a substrate; forming an amorphous silicon layer over the low-k dielectric layer; patterning the amorphous silicon layer to form a plurality of elongate line features, wherein at least a subset of the elongate line features define lateral dimensions of a plurality of first metal lines to be formed in the low-k dielectric layer; depositing a titanium oxide layer over the elongate line features; etching the titanium oxide layer to form spacer segments on sidewalls of each of the elongate line features; forming a tri-layer photoresist over the plurality of elongate line features and over the spacer segments, wherein the tri-layer photoresist includes a bottom layer, a middle layer disposed over the bottom layer, and a top layer disposed over the middle layer, the top layer containing a photo-sensitive material; forming a plurality of openings in the top layer via a lithography process; extending the openings into the bottom layer, wherein the extending is performed in a Radio Frequency (RF) power pulsing chamber via a plurality of pulsing cycles, wherein each pulsing cycle includes an etching step performed while the RF power is turned on and a polymer deposition step performed while the RF power is turned off, wherein the etching step etches the openings into the bottom layer, and wherein the polymer deposition step deposits a polymer layer on etched surfaces of the bottom layer; thereafter removing portions of the elongate line features that are located under the openings; thereafter removing the bottom layer along with portions of the polymer layer disposed on the bottom layer, wherein at least some portions of the polymer layer remain on sidewalk of the spacer segments disposed under the openings after the removing of the bottom layer, wherein a gap exists between the spacer segments that remain in the openings after the removing of the bottom layer, and wherein the gap defines lateral dimensions of a plurality of second metal lines to be formed in the low-k dielectric layer; thereafter etching a plurality of first and second trenches in the low-k dielectric layer, the first trenches corresponding with the first metal lines, and the second trenches corresponding with the second metal lines; and filling the first and second trenches with a metal material, thereby forming the first and second metal lines.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, comprising:
   providing a structure having a substrate, a plurality of patterned features disposed over the substrate, a first layer disposed over upper surfaces and side surfaces of the patterned features, and a second layer disposed over the first layer, the first layer and the second layer being photoresist layers;
   forming an opening in the second layer; and
   extending the opening into the first layer while depositing a protective material on side surfaces of the first layer and on surfaces of at least some of the patterned features exposed by the opening, the protective material protects the at least some of the patterned features from being damaged during the extending of the opening.

2. The method of claim 1, wherein the opening is extended into the first layer through an etching process, and wherein the forming of the protective material is performed substantially simultaneously with the etching process.

3. The method of claim 2, wherein:
   the etching process and the forming of the protective material are performed in a chamber using a radio frequency (RF) power pulsing function;
   the etching process is performed when an RF power is turned on in the chamber; and
   the depositing of the protective material is performed when the RF power is turned off in the chamber.

4. The method of claim 1, wherein the first layer and the second layer are parts of a tri-layer photoresist.

5. The method of claim 1, wherein the patterned features include silicon features and spacers formed on sidewalls of the silicon features, the spacers containing a dielectric material.

6. The method of claim 5, wherein the depositing of the protective material is performed such that at least some of the protective material is formed on sidewalls of the spacers.

7. The method of claim 6, further comprising: removing the first layer and the second layer, wherein portions of the protective material remain on sidewalls of the spacers after the first layer and the second layer have been removed.

8. The method of claim 5, forming a metal line of an interconnect structure.

9. A method of fabricating a semiconductor device, comprising:
   providing a structure having a substrate, a plurality of patterned features disposed over the substrate, a first layer disposed over upper surfaces and side surfaces of the patterned features, and a second layer disposed over the first layer, the first layer and the second layer being photoresist layers;
   forming an opening in the second layer; and
   extending the opening into the first layer via a plurality of cycles that each include an etching step to etch the first layer and a polymer deposition step to deposit a polymer layer, wherein the polymer layer protects portions of the patterned features under the opening from being etched during the etching step.

10. The method of claim 9, wherein:
    the etching step and the polymer deposition step are performed in a chamber inside which a radio frequency (RF) power is turned on and off repeatedly;
    the etching step is performed when the RF power is turned on; and
    the polymer deposition step is performed when the RF power is turned off.

11. The method of claim 9, wherein:
    the first layer is a bottom layer of a tri-layer photoresist;
    the second layer is a top layer of the tri-layer photoresist; and
    the tri-layer photoresist further includes a middle layer that is disposed between the bottom layer and the top layer.

12. The method of claim 9, wherein the patterned features include amorphous silicon features and dielectric spacers formed on sidewalls of the amorphous silicon features.

13. The method of claim 12, wherein the polymer deposition step is performed such that the polymer layer is deposited on sidewalls of the dielectric spacers during the polymer deposition step.

14. The method of claim 13, further comprising: removing the first layer and the second layer, wherein segments of the polymer layer still remain on sidewalls of the dielectric spacers after the first layer and the second layer have been removed.

15. The method of claim 13, forming a metal line of an interconnect structure.

16. A method of fabricating a semiconductor device, comprising:
    providing a structure having a substrate, a plurality of patterned features formed over the substrate, a first layer formed over and around the patterned features, and a second layer formed over the first layer, the first layer and the second layer being photoresist layers;
    forming an opening in the second layer;

etching the opening into the first layer;
depositing a protective layer in the opening as it is being etched, wherein the protective layer protects at least a subset of the patterned features from being etched; and
repeating the etching and the depositing a plurality of times.

17. The method of claim 16, wherein:
the etching and the depositing are performed in a chamber inside which a radio frequency (RF) power is pulsed on and off for a plurality of cycles;
the etching is performed when the RF power is pulse on; and
the depositing is performed when the RF power is pulsed off.

18. The method of claim 16, wherein:
the patterned features include amorphous silicon features and dielectric spacers formed on sidewalls of the amorphous silicon features; and
the depositing comprises depositing a polymer material on sidewalls of the dielectric spacers.

19. The method of claim 18, further comprising:
removing the first layer and the second layer, wherein segments of the polymer material still remain on sidewalls of the dielectric spacers after the first layer and the second layer have been removed; and
forming a metal line of an interconnect structure.

* * * * *